United States Patent [19]

Vaccaro et al.

[11] Patent Number: 5,323,402
[45] Date of Patent: Jun. 21, 1994

[54] PROGRAMMABLE SYSTOLIC BCH DECODER

[75] Inventors: John J. Vaccaro, Westford; Willard L. Eastman, Lexington; Thomas M. Hopkinson, Woburn, all of Mass.

[73] Assignee: The Mitre Corporation, Bedford, Mass.

[21] Appl. No.: 655,056

[22] Filed: Feb. 14, 1991

[51] Int. Cl.$^5$ ............................................. G06F 11/10
[52] U.S. Cl. ..................................... 371/37.1; 371/35; 371/37.8; 364/DIG. 1; 364/259.9; 364/262.2
[58] Field of Search ................. 395/800; 371/35, 37.1, 371/37.4, 37.5, 37.8, 37.9, 41

[56] References Cited

U.S. PATENT DOCUMENTS

| | | | |
|---|---|---|---|
| 4,360,916 | 11/1982 | Kustedjo et al. | 371/37.8 |
| 4,665,523 | 5/1987 | Citron et al. | 371/37.1 |
| 4,694,455 | 9/1987 | Koga | 371/37.1 |
| 4,719,628 | 1/1988 | Ozaki et al. | 371/37.4 |
| 4,856,004 | 8/1989 | Foster et al. | 371/37.8 |
| 4,866,716 | 9/1989 | Weng | 371/37.1 |
| 4,873,688 | 10/1989 | Maki et al. | 371/37.1 |
| 4,890,286 | 12/1989 | Hirose | 371/37.8 |
| 4,958,349 | 9/1990 | Tanner et al. | 371/37.1 |
| 5,099,482 | 3/1992 | Cameron | 371/37.1 |
| 5,107,503 | 4/1992 | Riggle et al. | 371/37.1 |
| 5,130,990 | 7/1992 | Hsu et al. | 371/37.1 |

OTHER PUBLICATIONS

Proceedings, Twenty-Seventh Annual Allerton Conference on Communication, Control, and Computing at Allerton House, Monticello, Illinois, Sponsored by the Coordinated Science Laboratory and the Department of Electrical and Computer Engineering of the University of Illinois at Urbana-Champaign, Sep. 27–29, 1989.
"A Programmable Systolic BCH Decoder," by John J. Vaccaro et al., Proceedings, Twenty-Seventh Annual Allerton Conference on Communication, Control, and Computing at Allerton House, Monticello, Illinois, pp. 336–345, Sep. 27–29, 1989.
"A VLSI Design of a Pipeline Reed-Solomon Decoder," by Howard M. Shao et al., IEEE Transactions on Computers, vol. C-34, pp. 393–403, May 1985.
"Systolic VLSI Arrays for Linear-Time GCD Computation," by R. P. Brent et al., VLSI '83, F. Anceau and E. J. Aas (eds.), Elsevier Science Publishers B.V. (North-Holland) pp. 145–154, 1983.
"Architecture for VLSI Design of Reed-Solomon Decoders," by Kuang Yung Liu, IEEE Transactions on Computers, vol. C-33, pp. 178–189, Feb. 1984.
"A 10 MHz (255,223) Reed-Solomon Decoder," by N. Demassieux et al., IEEE 1988 Custom Integrated Circuits Conference, 1988.
"A Fast VLSI Multiplier for GF($2^m$)," by P. Andrew Scott et al., IEEE Journal on Selected Areas in Communications, vol. SAC-4, pp. 62–66, Jan. 1986.
"Custom CMOS Reed Solomon Coder for the Hubble Space Telescope," by S. Whitaker et al., IEEE, pp. 116–120, 1990.
"A Gate-Array-Based Programmable Reed-Solomon Codec: Structure-Implementation-Applications," by T. Le-Ngoc et al., IEEE, pp. 121–125, 1990.
"Why Systolic Architectures?" by H. T. Kung, IEEE, pp. 37–46, 1982.
"Euclideanization of the Berlekamp-Massey Algorithm," by Willard L. Eastman, Proceedings of the 1988 Tactical Communications Conference, vol. 1, pp. 295–303, 1988.

Primary Examiner—Alyssa H. Bowler
Assistant Examiner—Mehmet Geckil
Attorney, Agent, or Firm—Choate, Hall & Stewart

[57] ABSTRACT

A programmable decoder that provides both error and erasure decoding for all Reed-Solomon, primitive BCH, non-primitive BCH, and binary BCH codes of any rate over any field is disclosed. The user can specify decoding parameters including the code block-length, the code-generator polynomial, and the field-generator polynomial. The basic architecture, less the small overhead for programmability, is also recommended for fixed-code applications. The decoding processor of the decoder includes systolic arrays implementing a syndrome calculator, a key equation solver, a Chien search, a recursive extender, and an inverse transform. The number of cells required for each of the five functions is on order of the error correction capability t. The systolic arrays can be fabricated on a single VLSI microchip that is itself systolic. Each of the individual systolic arrays can extended by arraying microchips together, so that any desired error correction capability can be attained by using multiple systolic microchips with a single controller.

19 Claims, 9 Drawing Sheets

```
i = 0
j = 0
r^O(x) = 1
r^T(x) = xS(x)
b^O(x) = 0
b^T(x) = 1
while ( 1 )
    b^O(x) = x b^O(x)
    r^O(x) = x r^O(x)
    b^N(x) = b^T(x)
    r^N(x) = r^T(x)
    j++
    if ( j > 2t ) break;
    if ( r_j^N ≠ 0 ) then
        b^T(x) = r_j^O b^N(x) - r_j^N b^O(x)
        r^T(x) = r_j^O r^N(x) - r_j^N r^O(x)
        if ( j > 2 I ) then
            b^O(x) = b^N(x)
            r^O(x) = r^N(x)
            I = j - I
        end if
    end if
end while
```

```
j = 0                              if ( j ≤ μ ) then ;  inner loop
l = μ                                  b^T(x) = (1 - W_j x) b^N(x)
p^O(x) = 1                             p^T(x) = (1 - W_j x) p^N(x)
b^O(x) = 0                         end if
p^T(x) = x S(x)                    elseif ( p_j^N ≠ 0 ) then ;  outer loop
b^T(x) = 1                             b^T(x) = p_j^O b^N(x) - p_j^N b^O(x)
while ( 1 )                            p^T(x) = p_j^O p^N(x) - p_j^N p^O(x)
    b^O(x) = x b^O(x)                  if ( j + μ > 2l ) then
    p^O(x) = x p^O(x)                      b^O(x) = b^N(x)
    b^N(x) = b^T(x)                        p^O(x) = p^N(x)
    p^N(x) = p^T(x)                        l = j - l + μ
    j++                                end if
    if ( j > 2t ) break             end elseif
                                end while
```

| TIME | CONTROL | (a) | (b) | (c) | (d) | (e) | (f) | (g) | (h) |
|---|---|---|---|---|---|---|---|---|---|
| A | 1 | $S_{4,1}$ | $S_{4,2}$ | $S_{3,0}$ | $S_{3,1}$ | $S_{3,2}$ | | | |
| B | 1 | $S_{4,0}$ | $S_{4,1}$ | $S_{4,2}$ | $S_{3,0}$ | $S_{3,1}$ | | | |
| C | 1 | $S_{5,2}$ | $S_{4,0}$ | $S_{4,1}$ | $S_{4,2}$ | $S_{3,0}$ | $(S_3\Lambda_3)_2$ | | |
| D | 1 | $S_{5,1}$ | $S_{5,2}$ | $S_{4,0}$ | $S_{4,1}$ | $S_{4,2}$ | $(S_3\Lambda_3)_1$ | $(S_4\Lambda_2)_2$ + $(S_3\Lambda_3)_2$ | |
| E | 1 | $S_{5,0}$ | $S_{5,1}$ | $S_{5,2}$ | $S_{4,0}$ | $S_{4,1}$ | $(S_3\Lambda_3)_0$ | $(S_4\Lambda_2)_1$ + $(S_3\Lambda_3)_1$ | $(S_5\Lambda_1)_2$ + $(S_4\Lambda_2)_2$ + $(S_3\Lambda_3)_2 = S_{6,2}$ |
| F | 0 | $S_{6,2}$ | $S_{5,0}$ | $S_{5,1}$ | $S_{5,2}$ | $S_{4,0}$ | $(S_4\Lambda_3)_2$ | $(S_4\Lambda_2)_0$ + $(S_3\Lambda_3)_0$ | $(S_5\Lambda_1)_1$ + $(S_4\Lambda_2)_1$ + $(S_3\Lambda_3)_1 = S_{6,1}$ |
| G | 0 | $S_{6,1}$ | $S_{6,2}$ | $S_{5,0}$ | $S_{5,1}$ | $S_{5,2}$ | $(S_4\Lambda_3)_1$ | $(S_4\Lambda_3)_2$ + $(S_5\Lambda_3)_2$ | $(S_5\Lambda_1)_0$ + $(S_4\Lambda_2)_0$ + $(S_3\Lambda_3)_0 = S_{6,0}$ |
| H | 0 | $S_{6,0}$ | $S_{6,1}$ | $S_{6,2}$ | $S_{5,0}$ | $S_{5,1}$ | $(S_4\Lambda_3)_0$ | $(S_4\Lambda_3)_1$ + $(S_5\Lambda_2)_1$ | $(S_6\Lambda_1)_2$ + $(S_5\Lambda_2)_2$ + $(S_4\Lambda_3)_2 = S_{7,2}$ |

*FIG. 18B*

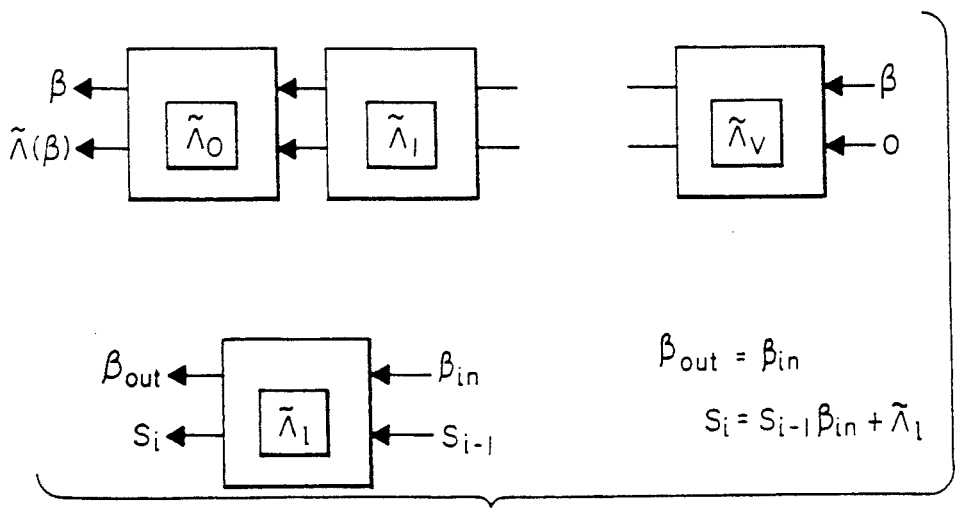

*FIG. 19*

PROGRAMMABLE SYSTOLIC BCH DECODER

BACKGROUND OF THE INVENTION

This invention relates to Bose-Chaudhuri-Hocquenghem (BCH) decoders, and in particular to programmable error and erasure correction decoders having a systolic architecture.

Although BCH codes are powerful and efficient, their decoding algorithms are computationally intensive finite-field procedures which require special-purpose hardware for high-speed area-efficient implementations. The solution of the key equation is the most difficult of the decoding operations and has been the subject of considerable research activity. Recent focus has been on developing algorithms that are well suited for VLSI implementation. Liu has proposed solving the key equation by a direct implementation of the Berlekamp-Massey algorithm ("Architecture for VLSI design of Reed-Solomon decoders" by K. Y. Liu, in *IEEE Trans. Computers*, Vol. C-33, No. 2, February 1984). This approach requires a field-element inversion within every iteration and a global broadcast of the discrepancy. These are both negative features, and the global broadcast is potentially a limiting factor in the performance of the system. A group at the Jet Propulsion Laboratory has developed a decoder where the key equation is solved using a greatest common divisor (GCD) implementation developed by Brent and Kung ("A VLSI design of a pipeline Reed-Solomon Decoder" by H. M. Shao et al. in *IEEE Trans. Computers*, Vol. C-34, No. 5, May 1985, and "Systolic VLSI arrays for linear-time GCD computations" by R. P. Brent and H. T. Kung in *VLSI '83*, North-Holland, 1983). This systolic GCD algorithm requires 2t cells and requires only local (cell-to-cell) communication. In addition, there is no need for a field-element inversion. However, every cell must compute several logical control signals and the resulting systolic cell is not regular.

SUMMARY OF THE INVENTION

The present invention is a programmable BCH decoder including a systolic decoder processor and a controller. The term "BCH" is herein defined to include all of the various embodiments of BCH codes including, but not limited to, all Reed-Solomon, primitive BCH, non-primitive BCH, and binary BCH codes of any rate. The decoder processor includes five systolic arrays implementing a syndrome calculator, a key equation solver, a zero locator, a recursive extender, and an inverse transform. The zero locator preferably implements a Chien search. The key equation solver is preferably mapped from the Eastman algorithm. Decoding parameters are input to the controller by the user to specify a BCH code. The controller receives a sequence encoded according to the BCH code and outputs a corresponding decoded sequence. The controller communicates with each of the systolic arrays of the systolic decoder processor to send and receive systolic inputs and outputs and further communicates with the processor as a whole to send timing and control data.

Decoding parameters that may be user programmable include the field, the block length, and the generator polynomial of the BCH code. In preferred embodiments, the decoding parameters include the field of the BCH code over the Galois field $GF(2^m)$ where m is an integer, resulting in a decoder that is field-programmable over the Galois field $GF(2^m)$.

In preferred embodiments, each said systolic array is a bit-serial processor. In a particularly preferred embodiment, the cells of each said systolic array have M bit-slices, and the programmable decoder is field-programmable over the Galois fields $GF(2^m)$ where m is an integer less than or equal to M. In an illustrative embodiment, M equals 8. In some embodiments, it is advantageous to limit the decoder to a code rate greater than $\frac{1}{2}$.

In one embodiment, the decoder is optimized for error-only decoding, and the syndrome calculator has 2t cells, the key equation solver has t+1 cells, the Chien search has t+1 cells, the recursive extender has t cells, and the inverse transform has t cells, where t is the error-correcting capability of the programmable decoder. In another embodiment, the decoder is optimized for error and erasure decoding, and the syndrome calculator has 2t cells, the key equation solver has t+1 cells, the Chien search has 2t+1 cells, the recursive extender has 2t cells, and the inverse transform has 2t cells, where $\nu$ errors and $\mu$ erasures can be corrected provided $\mu + 2\nu \leq 2t$.

In preferred embodiments, the systolic arrays are resident on a single systolic decoder processor microchip. Since each such microchip is itself systolic, microchips can be arrayed together to extend the number of cells of each of the arrays, resulting in a greater error correction capability. For example, the systolic decoder processor associated with a single controller may include an array of M microchips, each microchip including a first systolic array implementing a syndrome calculator with n1 cells, a second systolic array implementing a key equation solver with n2 cells, a third systolic array implementing a zero locator with n3 cells, a fourth systolic array implementing a recursive extender with n4 cells, and a fifth systolic array implementing an inverse transform with n5 cells, and further including communication links between the microchips such that the array of M microchips implements a systolic syndrome calculator with M×n1 cells, a systolic key equation solver with M×n2 cells, a systolic zero locator with M×n3 cells, a systolic recursive extender with M×n4 cells, and a systolic inverse transform with M×n5 cells.

Major attributes that derive from the decoder's programmable nature include:

(1) The decoder provides an off-the-shelf solution for a wide range of system applications. This allows communication system engineers to focus on the channel performance characteristics that various coding strategies offer, and not be concerned with decoder design considerations. This architecture provides a versatile tool for system engineers to apply.

(2) The tremendous flexibility of the decoder allows it to be dynamically reprogrammed. This allows communication systems to adaptively change their error correction coding strategy in response to changing channel characteristics.

BRIEF DESCRIPTION OF THE DRAWING

FIGS. 18A and 18B are schematic diagrams of an example bit-serial recursive extension.

FIG. 19 is a schematic diagram of a systolic Chien search array.

DESCRIPTION OF THE PREFERRED EMBODIMENT

Figure 1:
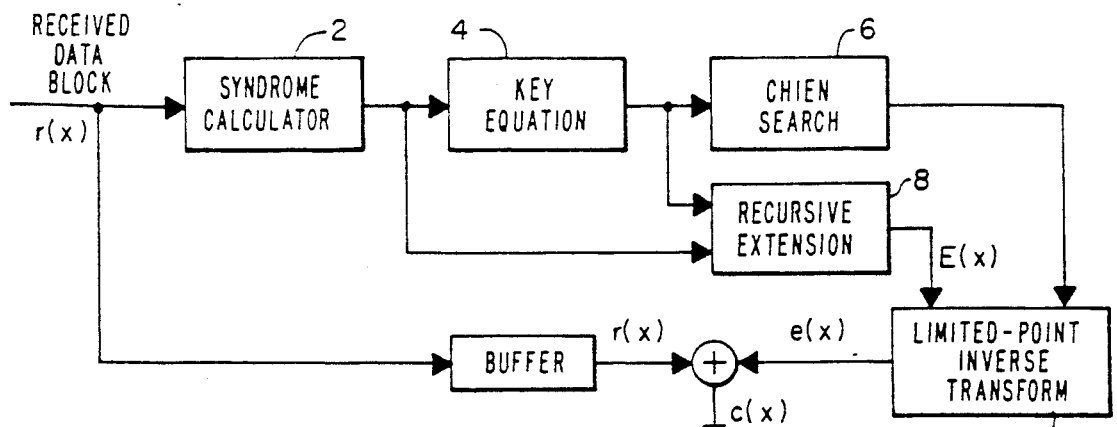
FIG. 1 is a block diagram of one embodiment of the decoding operations performed by the decoder of the present invention.

A block diagram of the decoding operations performed by a preferred embodiment of the present invention is presented in FIG. 1. There are five major components: a syndrome calculator 2, a key-equation solver 4 (which yields the error-locator polynomial), a Chien search 6 (which identifies the zeros of the error-locator polynomial), a recursive extender 8 (which produces a complete transform-domain error sequence), and a limited-point inverse transform 10.

For (n,k) BCH codes of finite field $GF(2^m)$, the received symbols are processed as a block of n symbols, where each symbol is an element of the finite field of the code. The received n symbols of a given block are $r_{n-1}, r_{n-2}, \ldots, r_0$ and can be viewed as the coefficients of a received polynomial r(x) where $$r(x) = r_{n-1}x^{n-1} + r_{n-2}x^{n-2} + \ldots + r_0.$$

The received polynomial is actually the sum of the original codeword polynomial c(x) and an error polynomial e(x). The polynomial e(x) represents the errors that were introduced during the transmission of the n symbol block.

The five components can all be realized as systolic arrays. For a review of the principles of systolic architectures, see "Why systolic architectures?" by H. T. Kung in *Computer*, January 1982. The syndrome calculator 2, the Chien search 6, and the inverse transform 10 are all partial number-theoretic transforms. Each can be evaluated via Horner's scheme, which results in a systolic cell that is based on a multiply-and-accumulate operation. A systolic technique for the recursive extender 8, $$E_k = \sum_{l=1}^{\nu} \Lambda_l E_{k-l},$$

has been presented by N. Demassieux et al. in "A 10 MHz (255,223) Reed-Solomon Decoder," *IEEE 1988 Custom Integrated Circuit Conference*, Vol. 17.6. The value $\nu$ is the number of actual errors present in a received block. A systolic approach for the key equation solver 4 can be based on Eastman's algorithm, described in detail below. (See also "Euclideanization of the Berlekamp-Massey Algorithm" by W. L. Eastman, *Tactical Communications Conference*, 1988.) This algorithm eliminates the need for field-element inversion and removes the need to calculate a vector inner-product (discrepancy) during each step in the iterative portion of the decoding process. Use of Eastman's algorithm results in a highly regular design that requires only local communication. The algorithm requires only t+1 cells, and easily handles decoding with erasures. With Eastman's algorithm, the number of systolic cells required to solve the key equation can be halved if code rates are restricted to be greater than ½.

Figure 2:
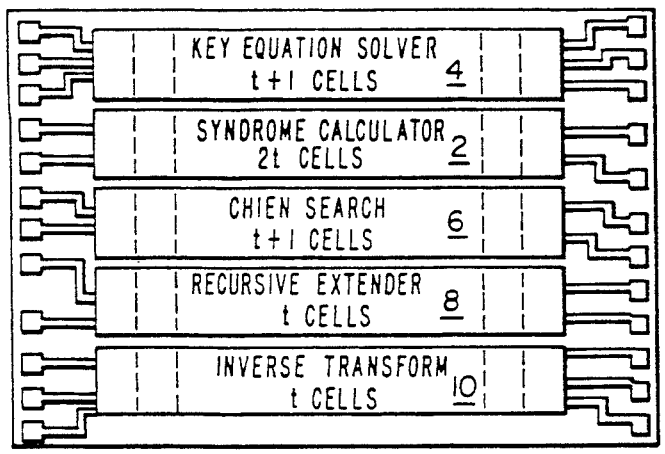
FIG. 2 is a depiction of one embodiment of the architecture of the systolic decoder processor of the present invention.

Each of the five components can be implemented as a systolic array on a single microchip 12, as illustrated in FIG. 2. As indicated in FIG. 2 and discussed further below, for t error-correction capability, the syndrome calculator 2 requires 2t systolic cells, the key equation solver 4 requires t+1 general systolic cells and one special left cell (located in the controller), the Chien search 6 requires t+1 systolic cells, the recursive extender 8 requires t general systolic cells and a unique left cell (located in the controller) corresponding to the unit coefficient of the error locator polynomial, and the inverse transform 10 requires t cells. For decoding with erasures, the Chien search, the recursive extender, and the inverse transform require additional cells, as will be demonstrated below.

Figure 3:
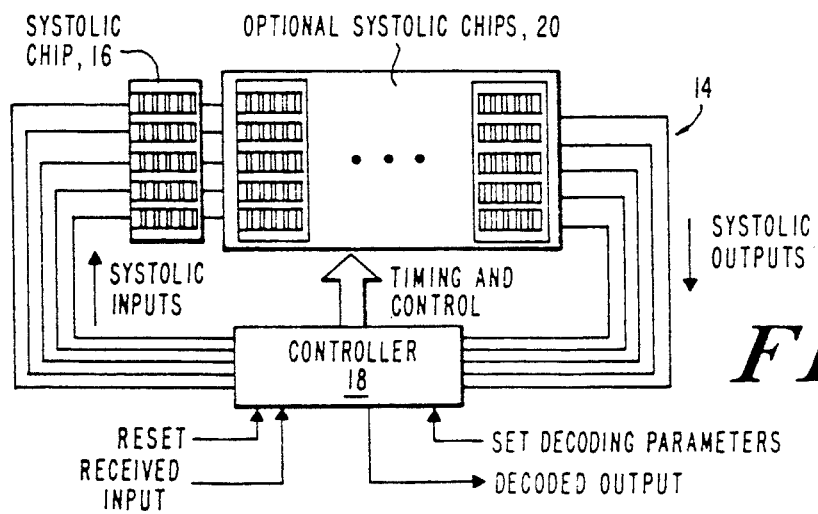
FIG. 3 is a depiction of one embodiment of the decoder of the present invention showing one or more systolic decoder processors and a controller.

A decoder according to a preferred embodiment of the invention is illustrated in FIG. 3. As indicated, the decoder 14 consists of two processors 16 and 18. Processor 16 is a systolic decoder processor containing five systolic arrays. The microchip 12 of FIG. 2 is an example of such a processor. Processor 18 is a controller which provides the necessary clocks and interfacing among the five systolic arrays. These individual systolic arrays preferably communicate exclusively with the controller.

One of the most attractive attributes of the system architecture is that the decoder microchip 12 of FIG. 2 is systolic. Each of the individual systolic arrays within the chip can be extended by arraying systolic decoder microchips together, so that any desired error-correction capability can be attained with a single controller. Additional systolic decoder microchips 20 are illustrated in FIG. 3 as an optional part of the systolic decoder processor 16.

In a preferred embodiment, the attractive features of finite-field arithmetic over fields $GF(2^m)$ are exploited. In general, any (n,k) code can be supported. It is preferred that each of the five systolic processors be a bit-serial processor for the resulting size advantage and for the ease with which a field-programmable multiplier can be implemented. The architecture is preferably based on a bit-slice architecture where each systolic cell consists of m bit-slices, providing a highly regular and easy to implement architecture. The finite-field arithmetic computations require no ripple between bit-slices, so that the speed of the system is equivalent to the speed of an individual bit-slice.

A specific proof-of-concept implementation has been completed. A system with eight bit-slices was implemented, supporting all fields with $m \leq 8$. A system requiring larger fields would simply require more bit-slices in the systolic cells. The implementation was restricted to codes in which $$\frac{k}{n} > \frac{1}{2}$$

for reasons to be further described below. A 20 MHz system clock was used to support a data bit rate of $$20 \frac{k}{n} \frac{m}{8}$$

mega-bits per second. The $$\frac{m}{8}$$

term is associated with an inefficiency in operating over fields smaller than GF(256). A systolic decoder microchip conforming to these specifications has been implemented in 2 μm CMOS through the MOSIS silicon foundry service. Even with this conservative technology a 16 error-correction capability was achieved on a single 7.9 mm×9.8 mm die, packaged in a 144 pin-grid-array (PGA). As many as four of these microchips can be arrayed for the error-only case while conforming to the restriction that m must be less than or equal to 8 and the code rate must be greater than ½. The maximum number of errors that can be corrected with such an array, in error-only decoding, is 63 with the use of a Reed-Solomon (255,129) code. Details of this proof-of-concept implementation will be further described below to illustrate the invention by way of example.

Programmable Multiplication Over GF($2^m$)

To allow user specified fields in the programmable decoder of the present invention, a programmable multiplier is required. Memory based multiplication is area expensive, and therefore is not used in the preferred embodiment. In a preferred embodiment, the multiplier architecture is an extension of a simple recursive multiplier (see, for example, "A fast VLSI multiplier for GF($2^m$)," by P. A. Scott et al., *IEEE Journal Sel. Areas Comm.* Vol. SAC-4, No. 1, January 1986) The recursive multiplier implements Horner's scheme, where each bit of the multiplier gates the full word multiplicand into a running sum. The multiplier bits are applied with the most significant bit (msb) first so that the running sum can be shifted one bit position (toward the msb) between each addition. This shift accounts for the relative position of each bit of the multiplier. After each shift, if the msb is a one, then the field GF($2^m$) has been exceeded and this shifted value must be remapped to a member in the field. If the field GF($2^m$) is viewed as being generated by a degree m polynomial, $$\sum_{i=0}^{m} F_i x^i,$$

where the most significant coefficient is a one, then within the field, $$x^m = \sum_{i=0}^{m-1} F_i x^i.$$

Whenever the most significant bit shifted is a one, it is mapped into the field by adding in the least significant m coefficients of the field generating polynomial during the next cycle. After all m multiplier bits have been applied (there is no shift following the application of the lsb) the product is complete.

Performing additions over GF($2^m$) is an Exclusive-Or of the respective bit positions of the two operands. The result is guaranteed to be in the field, requiring no field reduction operation. This suggests using the recursive multiplier as a sum-of-products processor where any number of multiplications can be simultaneously accumulated. This scheme is illustrated for a sum of two four-bit products (representing elements from GF($2^4$)) in FIG. 4. This circuit simultaneously performs the operation ab+cd. FIG. 5 contains a single bit-slice, $L_i$, of a sum-of-products processor. The number of input bits to the exclusive-or gate will grow with the number of products being summed.

Figure 4:
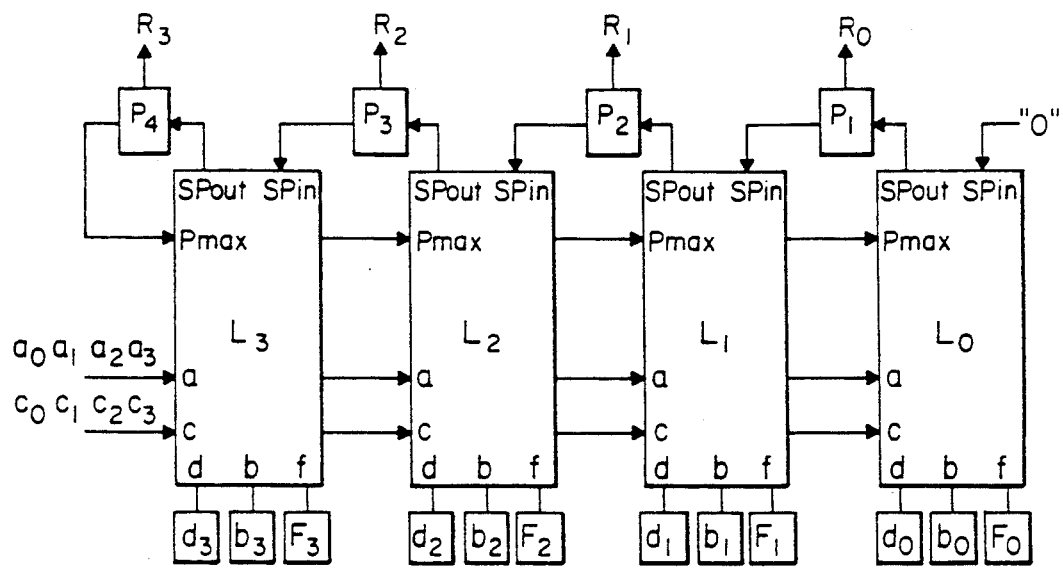
FIG. 4 is a schematic diagram of a 4-bit sum-of-products processor.
Figure 5:
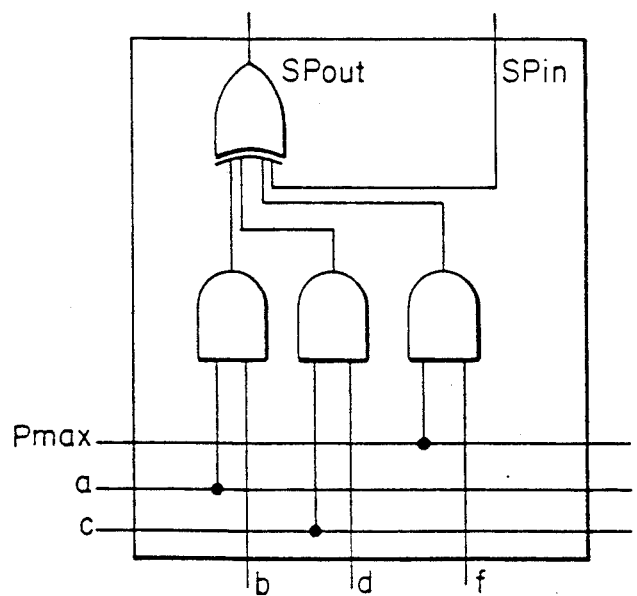
FIG. 5 is a circuit diagram of the $L_i$ cells of FIG. 4.
Figure 6:
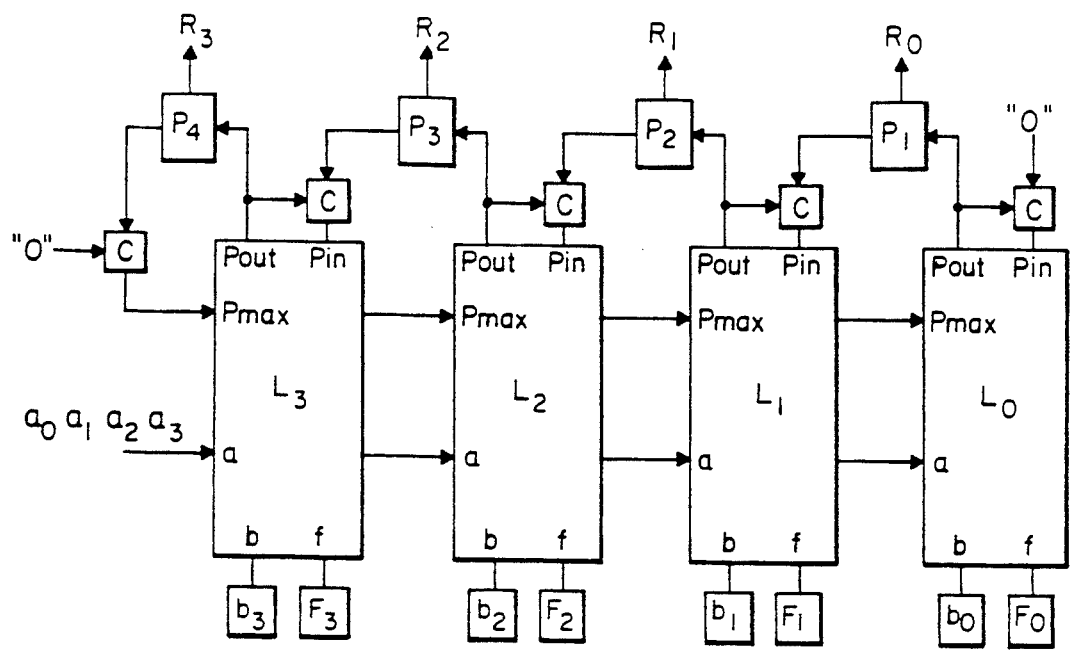
FIG. 6 is a schematic diagram of a programmable multiplier.

The sum-of-products processor of FIG. 4 is not directly programmable. FIG. 6 illustrates the additional hardware necessary to implement a programmable 4-bit multiplier. The register C has been introduced as a mechanism to hold the product in place when the field is less than the maximum supported by the hardware (an m bit-slice machine will always operate with m-cycle arithmetic). The user specifies the field reduction polynomial via an input port.

When operating over fields which are smaller than the largest supported field, all data items are left justified and zero-padded to fill to an m-length vector. If the field is GF(8) then the computation will take place in cells $L_3$, $L_2$, and $L_1$ of FIG. 6. A global control line allows the C register to select between a shifted input from the cell to the right and the cell's own output. During computation, the C register passes the data from the register $P_i$ into cell $L_i$. The cell's own output is selected when the multiplication is complete and the number of bits in the field is less than the maximum field supported by the hardware. In the case of GF(8) multiplication being performed on the processor in FIG. 6, the C register is used to recirculate the data only during the last of the four cycle process. This same C register is required to transform any sum-of-products processor into a programmable sum-of-products processor.

Systolic Decoder Architecture

The five major blocks of the decoder architecture are depicted in FIG. 1. The figure omits the LIFOs and FIFOs that align data as it moves between the processors. These memories, along with a few other circuits, are all contained within the controller. The following sections describe embodiments of the five components by way of example.

Syndrome Calculator 2

The only a priori knowledge that the decoder has available are the 2t zeros of the generator polynomial, $$g(x) = \prod_{i=0}^{2t-1} (x - \alpha^{U+i}),$$

that is used to encode the data. The first of the contiguous roots of g(x) is taken to be a $\alpha^U$. The decoder begins its process by evaluating the received polynomial r(x) at the 2t contiguous zeros of g(x). These 2t evaluations of a number-theoretic transform are called syndromes. The calculation of syndromes is a polynomial evaluation where the $j^{th}$ syndrome is $S_j = r(\alpha^j)$. Each syndrome will be computed using Horner's scheme:

$$r(x) = (\ldots(((r_{n-1})x + r_{n-2})x + r_{n-3})x + \ldots + r_1)x + r_0$$

This requires the coefficients of the received polynomial r(x) to be presented to the syndrome calculator with the most significant coefficient first. These syndromes are used in two places. All 2t syndromes are immediately used in the key equation solver 4, to produce the error locator polynomial, Λ(x), and t syndromes are stored for future use in the recursive extender 8. It is not critical which t syndromes are stored. When decoding with erasures, all 2t syndromes are needed by the recursive extender.

Figure 7:
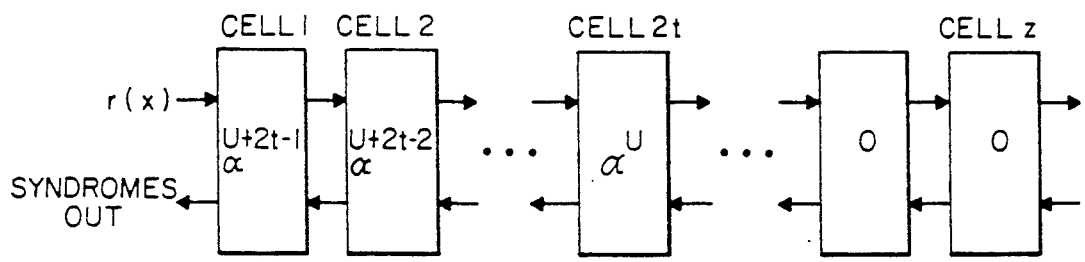
FIG. 7 is a schematic diagram of a systolic array for a syndrome calculator.
Figure 8:
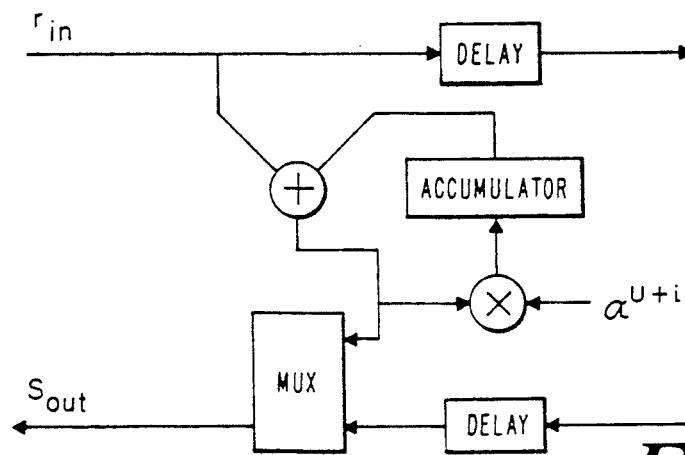
FIG. 8 is a schematic diagram of a systolic cell for the systolic syndrome calculator of FIG. 7.

A high-level architectural description of an embodiment of a systolic array that calculates the 2t syndromes in parallel is illustrated FIG. 7. FIG. 8 shows a high-level description of the workings of an embodiment of an individual systolic cell for the array. The systolic array calculates each syndrome in-place in a single systolic cell. The syndrome computed by a given cell is purely a function of the root of g(x) that is stored in that cell. The evaluation points, roots of g(x), are stored during initialization and remain fixed for a given code.

If a simple serial shift register were used to output the syndrome results, then the results would appear with interleaved don't care values. This results from the fact that as cell i is computing its result, the cell to its left, cell i−1, has just passed its result to the left. Thus, as cell i moves its data into position i−1, cell i−1 is outputting don't cares.

To alleviate this problem, systolic cells are preferably grouped into pairs where cell$_{i0}$ represents the left cell of pair i, and cell$_{i1}$ is the right cell of pair i. These two cells compute simultaneously, by having the same coefficient of r(x) simultaneously available to the pair of cells. The pair of cells complete their calculations simultaneously. These results go into two separate 8-bit serial shift registers that can be viewed as a psuedo 16-bit serial shift register that shifts data from right to left. It is only pseudo because the input to the tail of the 8-bit shift register associated with cell$_{i0}$ can come from two sources. The first source is cell$_{i1}$ which happens while cell$_{i0}$ is outputting to the left. Cell$_{i0}$ completes its output in 8 clock cycles, during which the results from cell$_{i1}$ have moved into the shift register associated with cell$_{i0}$. At the completion of these 8 clock cycles the cell-pair to the right, cell$_{i+1}$ has completed its computation. During the next clock cycle the tail of the shift register associated with cell$_{i0}$ receives its input from cell$_{i+1}$. cell$_{i+1}$ will remain the source until cell$_i$ completes its computation again. A pictorial representation of this output process is presented in FIG. 9. The computation in cell-pair (i) completes at time = t while the computation in cell-pair (i+1) completes at time = t+8. Note that within a given cell-pair the switch is down for only 8 clock cycles every complete block period (8n clock cycles). The syndrome calculator outputs exit in a sequential stream, the highest order syndrome first, with the most significant bit first within each syndrome. This is the exact order and format required by the key equation processor in the embodiment described below.

Key Equation Solver 4

This section describes an algorithm and circuit implementation for solving the key equation. The algorithm, referred to as Eastman's algorithm, is the preferred, but not the only, algorithm for the programmable systolic architecture of the invention. Other algorithms that can be mapped into systolic hardware architectures are also appropriate and within the scope of the invention (see, for example, Shao et al., cited above). First a technique is presented for error only decoding, and then the technique is extended to include erasures.

Given 2t syndromes, $S_j$; j=0,1,...2t−1, a syndrome polynomial is defined as $$S(x) = \sum_{j=0}^{2t-1} S_j x^j.$$

Without loss of generality, the first root of the generator polynomial has been chosen to be $\alpha^U$; the system inherently supports the choice of any first root. The error locator polynomial is defined as $$\Lambda(x) = \prod_{l=1}^{\nu} (1 - X_l x) = 1 + \sum_{i=1}^{\nu} \Lambda_i x^i,$$

where the $X_l$ are the error locations and the zeros of Λ(x) are related to the inverse error locations. The polynomials Λ(x) and S(x) satisfy the recursion $$-S_{j+\nu} = \sum_{i=1}^{\nu} S_{j+\nu-i}\Lambda_i,$$

where j=0,1,2,...,ν−1. The solution of the key equation, $$\Omega(x) = \Lambda(x)S(x) \pmod{x^{2t}},$$

provides the $\Lambda_i$'s that satisfy the recursion.

Historically, solving this equation for Λ(x) has been the most computationally intense operation in the decoding chain. There exist algorithms based on the Euclidean algorithm for polynomials as well as shift-register synthesis techniques such as the Berlekamp-Massey algorithm. Eastman has developed a variation on these techniques that is well suited for VLSI implementation. This algorithm involves no global broadcasts and is implementable as a systolic array with nearest neighbor communications. This algorithm produces a scaled error-locator polynomial, $\overline{\Lambda}(x) = \gamma \Lambda(x)$.

The results of the key equation solver go to two different processors. The first is the Chien search 6, which locates the zeros of the error-locator polynomial, Λ(x). Since $\overline{\Lambda}(x)$ has the same zeros as Λ(x), the Chien search uses the scaled polynomial generated by the Eastman key equation solver. The second destination of $\overline{\Lambda}(x)$ is the recursive extender 8 which requires the least significant (or the most significant) coefficient of Λ(x) to be one. Whether it is the least significant or most significant is a function of whether the recursion $$\sum_{l=0}^{v} \Lambda_l S_{k-l} = 0$$

is solved in the forward or reverse direction. The forward direction provides a more natural data flow from the syndrome calculator through to the inverse transform.

Figures 9, 10:
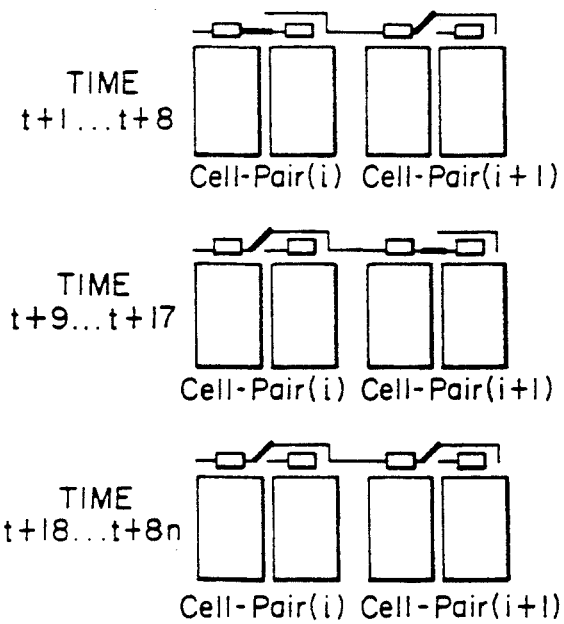
FIG. 9 is a schematic diagram of an output process of a systolic syndrome calculator.
FIG. 10 is a listing of the Eastman key equation algorithm.

An embodiment of a program that, given the syndromes $S_j$, will calculate $\bar{\Lambda}(x)$, is provided in FIG. 10. In this program, $b^N(x) = \bar{\Lambda}(x) = \gamma \Lambda(x)$. The discrepancy (of the Berlekamp-Massey algorithm) for the jth iteration is simply $r_j^N$, where $r_j^N$ is the jth coefficient of the $r^N(x)$ polynomial. Eastman's algorithm successively zeros out the lowest coefficient of $r^N(x)$ during each iteration, so that after the jth iteration the least significant j coefficients are zero.

There are four polynomials in Eastman's error-only algorithm, $b^O(x)$, $b^N(x)$, $r^O(x)$, and $r^N(x)$, ($b^T(x)$ and $r^T(x)$ are temporary polynomials). The polynomial $b^N(x)$ is akin to Massey's generated shift register connection polynomial, and $b^O(x)$ is the old shift register that is used to calculate it. A new shift register $b^T(x)$ must be created when the current shift register $b^N(x)$ fails to predict the next element of the recursion. The previous shift register $b^O(x)$ had a discrepancy $r_j^O(x)$ and the new shift register is constructed from the two previous shift registers as $$b^T(x) = r_j^O b^N(x) - r_j^N b^O(x).$$

Eastman mapped the algorithm of FIG. 10 into a two-dimensional systolic array consisting of 2t rows, where data moving between all cells is clocked. Each row in the 2-D array consists of a single special left cell, depicted in FIG. 11, and many identical general cells, depicted in FIG. 12. The delay in FIG. 11 is required because the left-most general cell must wait for its upper right neighbor to complete before it can execute.

Figure 12:
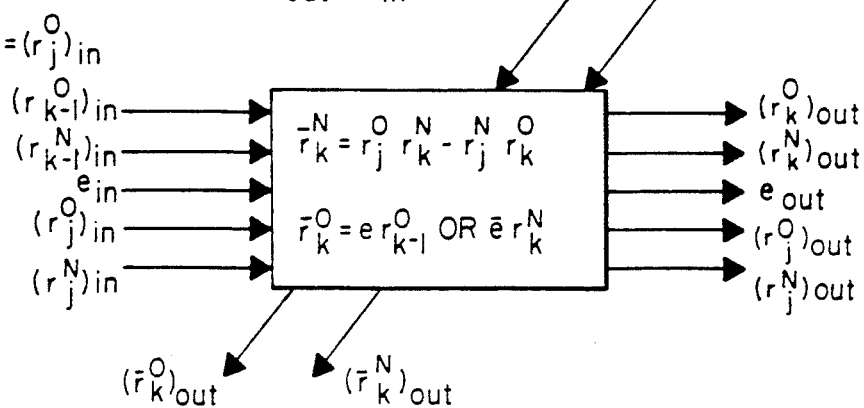
FIG. 12 is a schematic diagram of a general cell for a systolic key equation solver.

Looking at the general cell of FIG. 12, the $r^N(x)$ polynomial is shifted left between each level, equivalent to the position j incrementing in the program of FIG. 10. The shift occurs because the output of row i, $\bar{r}_k^N$, becomes the input $r_k^N$ at row i+1. The $(k-1)^{st}$ coefficient of the polynomial $r^N(x)$ is $r_{k-1}^N$. In the algorithm the polynomial $r^O(x)$ is shifted right during each iteration to force the previous discrepancy to be in the $j^{th}$ position. The algorithm shifts $r^O(x)$ to the right between each loop (or stage), but the cell inherently shifts it left, so that the net effect is that the polynomial stays in place. The shift right is effected by having the output $\bar{r}_k^O$ as a function of the coefficients of one degree less, $r_{k-1}^O$ and $r_{k-1}^N$.

Figure 11:
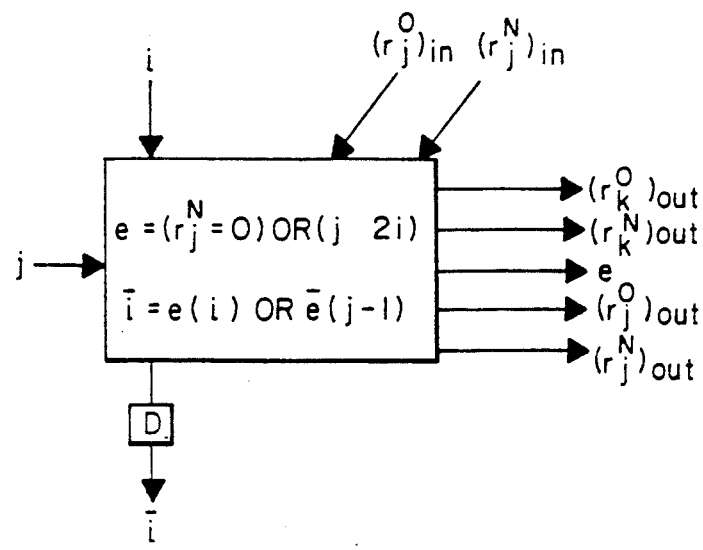
FIG. 11 is a schematic diagram of a special left cell for a systolic key equation solver.

The special left cell of FIG. 11 provides the current and previous discrepancies to the entire row along with the control signal e which tells the cell that a shift register length change has occurred, requiring the old polynomials to be updated, $r^O(x) \leftarrow r^N(x)$ and $b^O(x) \leftarrow b^N(x)$.

With a 2-D array, the hardware can simultaneously process 5t codewords. The key equation data associated with a single received data block is in a single column every other cycle. This fact will be exploited later to compress this two-dimensional array into a one dimensional array.

If 5t syndrome polynomials were simultaneously available then it would be possible to keep all cells in the array 100% utilized. This 2-D capability would provide a tremendous decoding throughput. However, in a single channel system, the data will arrive serially and the syndromes need only be computed sequentially; it is necessary for the key equation processor to complete before a new syndrome polynomial is computed. In this case there will be many idle cells and the 2-D array utilization is extremely low.

Figure 13:
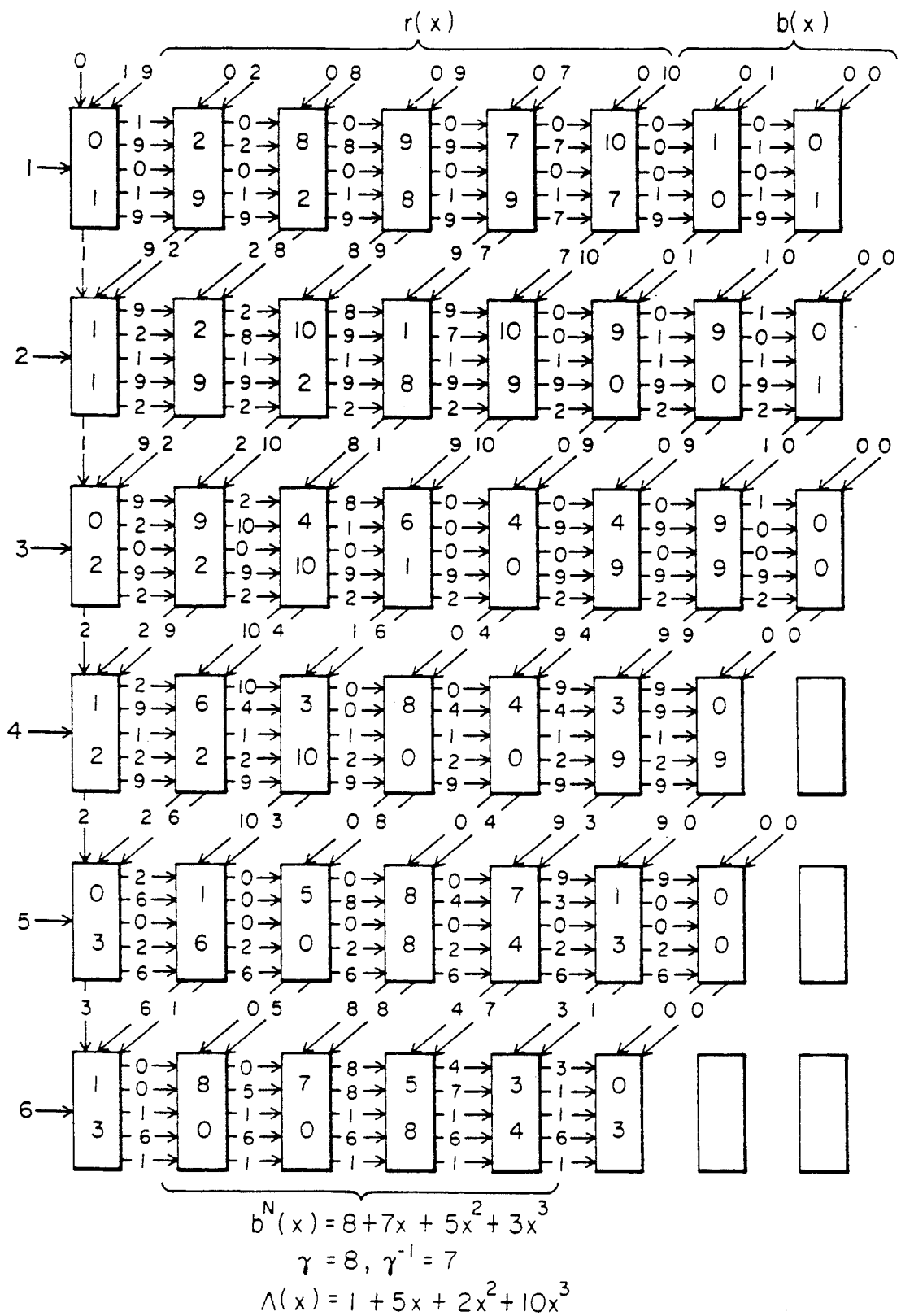
FIG. 13 is a schematic diagram of an Eastman 2-D systolic array for a key equation solver incorporating the special left cell of FIG. 11 and the general cell of FIG. 12.

Consider $b^N(x)$ as it exits the bottom row of the 2-D array. As the data is shifted left on each successive stage, the two polynomials $b^N(x)$ and $r^N(x)$ must be prevented from interfering with each other. There are 2t iterations, or stages in the algorithm, and it can be shown that there are at most t length changes for the $r^N(x)$ polynomial. Thus, the polynomial $r^N(x)$ can grow by at most t coefficients. The polynomial $b^N(x)$ will shift left one position every stage of the architecture. Since the $r^N(x)$ polynomial is used to provide discrepancy values for each of the 2t iterations of the algorithm, the coefficients of $r^N(x)$ greater than 2t are never used. Thus it is only necessary to maintain the position of the $2t^{th}$ coefficient of $r^N(x)$ so that $b^N(x)$ can begin in the adjacent cell. It is only necessary that the $r_{k-1}^O$ and $r_{k-1}^N$ inputs to the least significant cell of the $b^N(x)$ polynomial both be set to zero. This is easily done algorithmically, and is shown in FIG. 13, where a dashed line separates the r and b polynomials.

At any instant of time, within each column of the 2-D array each problem appears at most once, suggesting that the 2-D array can be compressed into a single row. Using a single row will require 2t iterations to solve a single key equation problem. With a single row architecture assume that at time $\tau$ cell i is operating on iteration v, (i.e. row v of the 2-D case). Then at time $\tau+1$ cell i+1 operates on its iteration v, since it required inputs from cell i. However, cell i cannot execute its iteration v+1 until cell i+1 completes its iteration v. Thus cell i executes iteration v+1 at time $\tau+2$, and each cell is seen to be utilized 50% of the time. In a straight-forward implementation this corresponds to a total compute time of 4t for each cell.

With a 1-D array, the syndromes are input in a serial fashion on a dedicated input shift-register to initialize the special left cell and the left-most 2t−1 general cells. The most significant coefficient of S(x) is input first and ends up in general cell (2t−1). The special left cell gets initialized with the least significant coefficient of S(x). The polynomial $b^N(x)$ initialization begins in cell 2t, this cell receives the least significant coefficients of $b^N(x)=1$ and $b^O(x)=0$ (see FIG. 10). Initialization to the right of cell 2t depends upon the number of cells that are in the array.

Since this decoder is programmable in the number of errors t that it can correct, the number of available cells will often exceed the 2t necessary for any particular code. Thus, it must be ensured that the cells to the right of cell 2t do not interact with the formation of $b^N(x)$. The least significant coefficient of the $b^N(x)$ polynomial will shift left one position on every iteration of the algorithm. When the algorithm terminates, the least significant coefficient of the $b^N(x)$ polynomial resides in the left-most general cell. The resultant $b^N(x)$ can have at most t+1 coefficients, and it must be ensured that as the $b^N(x)$ polynomial is growing toward the right that it is not corrupted by data moving toward the left from unused cells. At termination, cell t+2 is the first cell that will not contribute to the solution. Since the entire structure has been shifting left on each iteration, cell t+2 at the termination of the algorithm corresponds to cell 3t+1 in the initialized array. During initialization the least significant coefficient of $b^N(x)$, which resides in cell 2t, must be followed by t zeros. If there are fewer than 3t general cells in the system, then the right-most cell must have all its right-inputs set to zero and all the cells to the right of cell 2t must be initialized to zero.

The special left-cell also requires initialization. It has the identical initialization procedure as the general cells, and is part of the contiguous initialization shift-register. The first syndrome $S_0$, which enters the array last, is placed in the special left cell and represents $r_j^N$ for $j=1$. The $r^O(x)$ polynomial is initialized to 1 (see FIG. 10). All the general cells have their coefficient of $r^O(x)$ initialized to zero.

Every cell must perform 2t iterations of the algorithm presented in FIG. 10. With the completely pipelined 1-D system the left-most cell will finish first followed by the second cell, then the third all the way through to cell (t+1). Each cell places its results into a static register, and when cell (t+1) is finished, these static registers are configured into a single bit-serial shift-register for outputting the results of the key equation processor.

For codes with rates greater than ½, the 50% cell utilization can be exploited to reduce the number of general cells by 50%. The significance of ½ rate codes is that for codes with rates which are greater than ½, there will never be syndromes available from a second block prior to the completion of the current block. This is based on the embodiment presented above for the syndrome calculator and is consistent with a pipelined decoder where all processing is accomplished with similar technology. The opportunity to fold the cell exists because within any pair of neighboring cells, only one is active at any particular time. By adding a small amount of additional control logic, the arithmetic section of a single cell can be shared between two adjacent general cells.

Consider the operation of the $i^{th}$ cell-pair. (Remember that the right and left cells within this pair cannot be active simultaneously.) When the $i^{th}$ cell-pair's right-cell is active it receives inputs from the left-cell of cell-pair (i+1) and inputs from the left-cell of cell-pair i. Then when the left-cell of the $i^{th}$ cell-pair is active, it receives its inputs from the right-cell of the $i^{th}$ cell-pair and the right-cell of cell-pair (i−1).

Figures 14, 15:
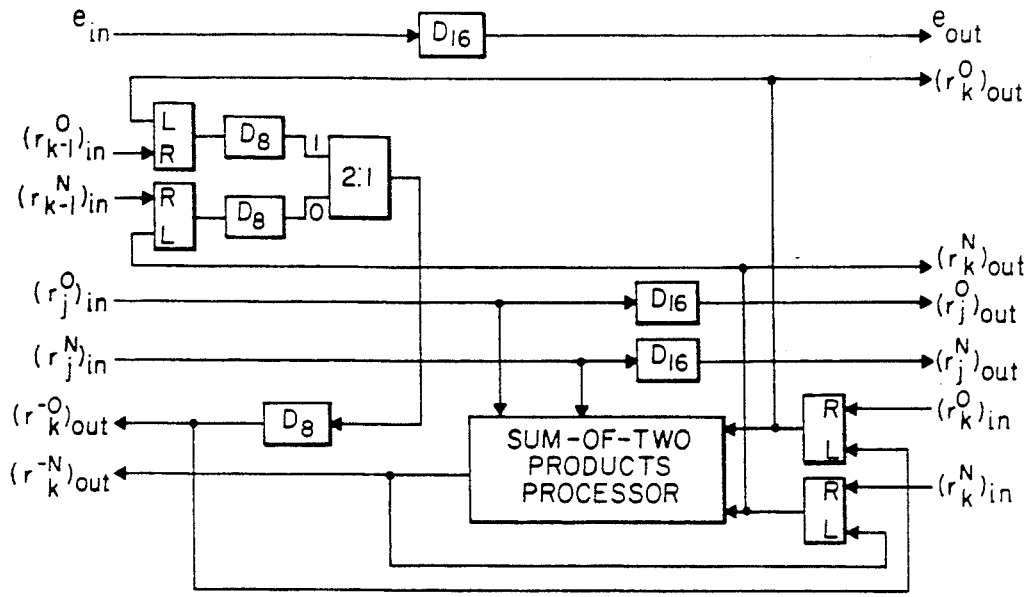
FIG. 14 is a schematic diagram of a folded 1-D general cell (error only) for a systolic key equation solver.
FIG. 15 is a listing of the key equation algorithm with erasures.

Two general cells can be replaced by the single folded cell of FIG. 14. Only a few changes are necessary. Four multiplexers are required to direct inputs and additional delays for e, $r_j^N$, and $r_j^O$. The delays are increased because each of these signals that are generated by the special left cell must be seen by both the left-cell and right-cell of each cell-pair. The special left-cell is preferably placed in the controller to allow the general cell array to be expandable from chip to chip.

R. E. Blahut (*Theory and Practice of Error Control Codes*, Addison-Wesley, 1983) demonstrated that the decoding of erasures can be performed using an identical algorithm to that of error-only decoding provided that modified syndromes (see "On decoding BCH codes" by G. D. Forney, *IEEE Trans. on Inf. Theory*, Vol. IT-17, 1971) are used to initialize the algorithm. This partitions the decoding algorithm into two distinct loops, an initialization loop that calculates the modified syndromes and a main recursion.

The initialization loop requires the number of erasures that exist for this data block $l=\mu$ be known. The initialization loop calculates the modified syndrome polynomial $p^N(x)$, $$\bar{p}^N(x) = xS(x) \prod_{k=1}^{\mu} (1 - W_k x),$$

and the erasure locator polynomial that is used as the initialization of the connection polynomial, $$b^N(x) = Y(x) = \prod_{k=1}^{\mu} (1 - W_k x).$$

$p^N(x)$ is equivalent to $r^N(x)$ in the errors-only decoder. The $W_k$ are the $\mu$ known erasure locations. With $p^N(x)$ and $b^N(x)$ initialized as above, Eastman's array (FIG. 13) could be used to compute the final erasure and error locator polynomial $$\pi(x) = Y(x)\Lambda(x).$$

The number of stages required in the 2-D case is $2t - \mu$.

From a hardware perspective it is extremely desirable to embed the initialization process within the normal computation structure so that the algorithm executes in a fixed number of steps independent of the number of erasures. FIG. 15 presents an algorithm where the iterative generation of the erasure polynomial takes place within the main body of the program. There are two distinct loops within the main iteration. The inner loop establishes the initialization conditions for $b^N(x)$ and $p^N(x)$, and will execute $\mu$ times. The outer loop executes the remaining $2t - \mu$ times to complete the algorithm. In both loops the polynomials $b^N(x)$ and $p^N(x)$ are updated as a sum-of-two-products. Since it is known which of the loops are executing at any given time, a single sum-of-two-products processor can be used as the heart of an errata-decoding cell. The inputs to this sum-of-products processor can be controlled by knowing whether the inner (erasure loading) or outer loop of FIG. 15 is executing.

The polynomial update on a coefficient-by-coefficient basis when executing the inner loop is $$(\bar{p}_k^N) = p_k^N - W_j p_{k-1}^N$$

Figure 16:
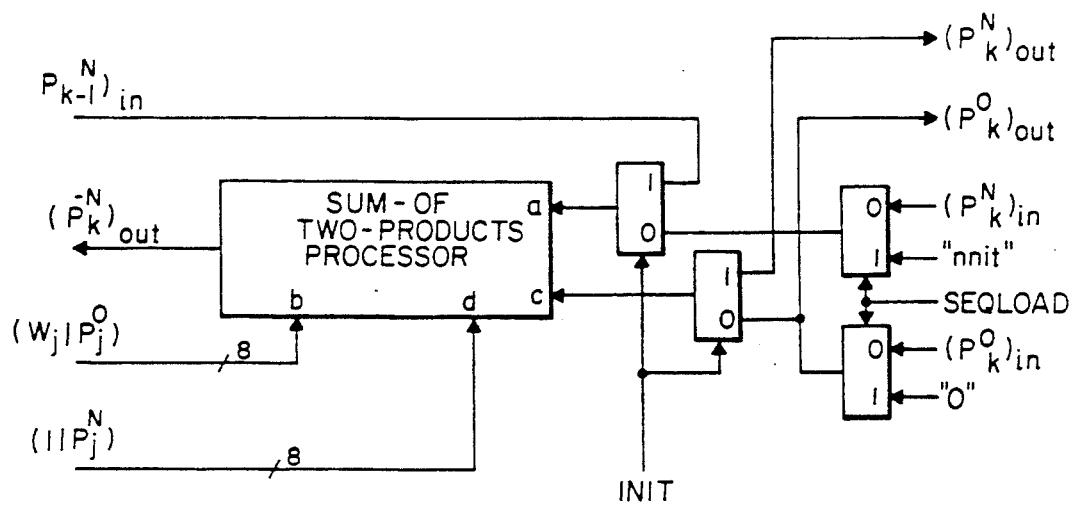
FIG. 16 is a schematic diagram of the control of a sum-of-two products processor.

FIG. 16 shows the control of the sum-of-two-products processor. The sum-of-two products processor forms $ab + cd$, where a, b, c, and d are inputs. The special left cell must use the two 8-bit buses in two different manners, depending upon whether or not the system is executing the inner or outer loop. When the inner loop is executed, $W_j$ must enter on the $p_j^O$ port and the value of 1 must enter the $p_j^N$ port. When executing the inner loop, init is high and the circuit in FIG. 16 is seen to form the result $(\bar{p}_k^N)$. When the outer loop of FIG. 15 is entered, init is off and the general cell functions identically to the non-erasure cell presented in FIG. 14.

Recursive Extension 8

The syndromes $S_j$ that are calculated via the syndrome calculator 2 are purely a function of the error polynomial e(x), and the syndromes can be viewed as 2t error transform points $E_j$. The recursive extender establishes the full n points of the transform domain representation E(x) by use of the recursion $$E_k = \sum_{l=1}^{v} \Lambda_l E_{k-l}$$

This processor receives as inputs (from the syndrome calculator) the t values $E_U, \ldots, E_{t-1+U}$, and these are used as the seeds for the recursion which produces in succession $E_{t+U}, E_{t+U+1}, \ldots, E_{n-1}, E_0, \ldots, E_{U-1}$.

Prior to the recursive extender the $\tilde{\Lambda}(x)$ must be reduced to $\Lambda(x)$ where the least significant coefficient is one. The coefficients exit the key equation solver least significant coefficient first. A circuit between the key equation solver and the recursive extender establishes the field element inverse of the least significant coefficient and then multiplies all the other coefficients by this value.

Figure 17:
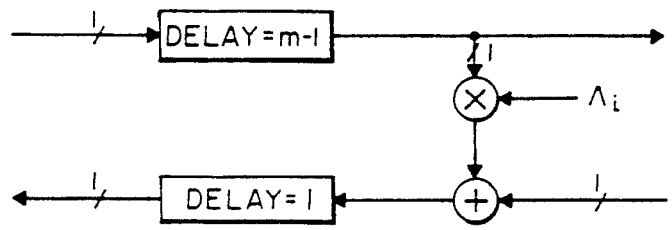
FIG. 17 is a schematic diagram of a general cell of a bit-serial systolic recursive extender.

An embodiment of a general cell for bit-serial systolic architecture is shown in FIG. 17. For a field with m-bit symbols the top path has a delay of m−1. The bottom path always has a delay of one. The recursive multiplier works by bringing in one multiplicand bit at a time beginning with the most significant bit. The multiplier value $\Lambda_i$ is an m-bit word that is static for the computation.

Figure 18A:
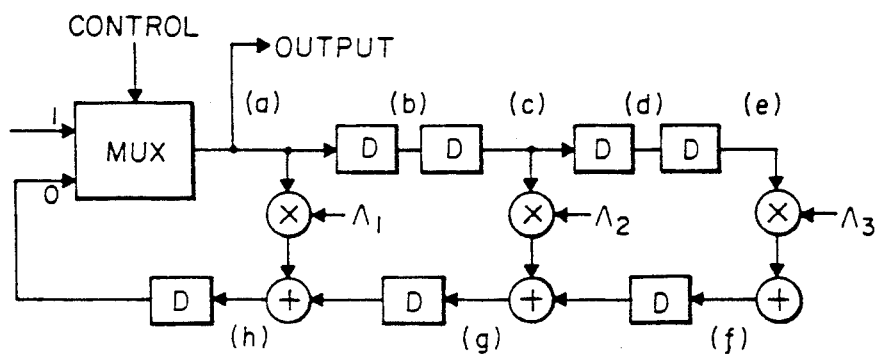

An example of the use of the cell in a systolic array is presented in FIGS. 18A–18B. Here operation is over GF(8), i.e. m=3. The ith bit of the kth syndrome is represented as $S_{k,i}$. When the multiplier outputs the ith bit of a product $S_u\Lambda_v$, it is represented as $(S_u\Lambda_v)_i$.

In general, the inputs to the circuit will be the 2t syndromes $S_0, S_1, S_2, S_3, S_4$, and $S_5$ and they will enter msb first within each symbol. $S_0, S_1, S_2$ are output immediately since the multiplexer is in position 1. Then $S_3$, $S_4$, and $S_5$ are also output immediately; but additionally these three syndromes are involved in the computation of our first extended syndrome. FIGS. 18A–18B, at time A, shows $S_{3,2}$ entering the far right multiplier. With the arrival of the lsb $S_{3,0}$ at the far right multiplier, the product $S_3\Lambda_3$ is completed at time C. A multiplier always completes its multiplication once it receives an lsb. On the same cycle that the multiplication is completed the computation of the single bit adder (exclusive-or gate) is also executed so that the resultant bit is waiting at the input to the delay. Between each cell there are m−1 delays along the input path so that the neighbor to the left is outputting the $i^{th}$ bit of the next product as the $i^{th}$ bit from the right arrives through the delay. In this way the proper bits always see one another. The multiplexer is switched to the zero position at time F in FIGS. 18A–18B, so that the generated syndromes can be used to continue the recursion. There must be no effective delay through the multiplexer for proper timing.

The above example illustrates the case where m=3. Consider the case where m≦8. Such a decoder would be preferably designed to always operate on eight bit symbols, with the m-bit symbols justified to the most significant m bits of the eight bit word. To support programmability, the general cell of FIG. 17 would have seven delays in the upper path, and these seven delays would always be used.

The special left cell of FIGS. 18A–18B is associated with the assumed least significant coefficient $\Lambda_0=1$ as well as the coefficient $\Lambda_1$. Note that there is no upper delay in this cell. This special left cell is placed in the controller, allowing the systolic array placed on the systolic chip to consist entirely of general cells. In a programmable array where the number of physical cells in the array, z, exceeds the correction capability of the code t, it must be ensured that the rightmost z−t cells do not corrupt the calculation. This is accomplished by continuously loading zeros as the $\Lambda$ value of each unused cell.

Chien Search Processor 6

The Chien search identifies all zeros of the error locatator polynomial by directly evaluating $\tilde{\Lambda}(x)$, at all n locations. This is accomplished by evaluating the polynomial at $\alpha^1, \alpha^2, \ldots, \alpha^{n-1}$ then $\alpha^0$. These field elements are easily generated in a recursive fashion. If $\alpha^l$ is a zero of $\tilde{\Lambda}(x)$, then there exists an error in the −1 mod n position of the received polynomial r(x). An error at location −1 means that the $l^{th}$ point of the inverse transform must be evaluated to determine the value of the error. This corresponds to evaluating E(x) (produced by the recursive extender 8) at the value $\alpha^l$. This is exactly the term that caused a zero in the Chien search, and this value is directly used in the inverse transform. The polynomial evaluation performed by the Chien search is compared to zero while $\alpha^i$ is delayed awaiting the evaluation. If a zero is detected then $\alpha^i$ is stored by using the zero detect output as a write enable to a LIFO. All n zero detect evaluations (whether a 1 or 0) are stored into a FIFO. These are used to control the exclusive-or process that subtracts the error values from r(x) to produce the decoded output sequence c(x).

An embodiment of a systolic array for implementing the polynomial evaluations of the Chien search is illustrated in FIG. 19 which is a direct implementation of Horner's scheme. In a programmable array where the number of physical cells in the array, z, exceeds the correction capability of the code t, it must assured that the unused z−t cells do not corrupt the calculation.

Inverse Transform 10

The inverse transform calculates the at most t inverse transform points at each of the identified error locations. The transform domain polynomial E(x) is evaluated at these points via Horner's scheme. The transform domain polynomial arrives from the recursive extender in the order $E_{U-1}, \ldots, E_0, E_{n-1}, \ldots, E_U$, and the inverse transform directly calculates $$e_s^t = \sum_{i=0}^{n-1} E_{i+U}\alpha^{-is}$$

The desired inverse transform is $$e_s = \sum_{i=0}^{n-1} E_i\alpha^{-is}.$$

The shift property for transforms allows us to express the desired outputs $e_s$ in terms of the computed values $e_s^t$ $$e_s = \alpha^{-Us}e_s^t.$$

This multiplication is applied just prior to the exclusive-or with the original r(x).

The systolic array for implementing the inverse transform is preferably identical to the array used to calculate syndromes.

Error-Plus-Erasure System Concept

Decoding with erasures exploits a priori information in the decoding algorithm. This a priori information is knowledge of the existence of errors in known locations. The values of these errors are not known, only their locations. This information increases the total number of errors that can be corrected by a given code. If a code supports an error-only correction capability of t, then when this same code is used for error and erasure decoding any combination of $\nu$ errors and $\mu$ erasures can be corrected, provided that $\mu+2\nu \leq 2t$. For this design the location information of the $k^{th}$ erasure, $W_k$, provided to the decoder takes on the form, for an error in symbol location l, $$W_k = \alpha^l$$

where $\alpha$ is a primitive generator of the field.

The polynomial whose zeros correspond to the error locations is called the errata polynomial, this is akin to the error locator polynomial for error-only decoding. The largest errata polynomial will be of degree 2t. In this case the key equation solver will produce $2t+1$ coefficients.

The system level architecture presented in FIG. 1 is almost unchanged when the decoder accepts erasures. Since the system must support more errors, several of the LIFOs and FIFOs must be sized accordingly, and the key equation solver, Chien search, recursive extender, and inverse transform all require small changes to support decoding with erasures. The Chien search, the recursive extender, and the inverse transform only require more cells to support the increased error correction capability when processing with erasures. The Chien search requires $2t+1$ cells instead of the $t+1$ cells needed for error-only decoding. The recursive extender requires 2t cells, up from the error-only requirement of t cells. And 2t inverse transform cells are needed instead of the t that are necessary for error-only decoding. As shown above, the key equation algorithm is easily extended to support erasure decoding. The implications on the key equation solver hardware are that the decoding of erasures can be performed on the same $t+1$ cells, with slight modifications to the cells, that are used for error-only decoding.

As shown in FIG. 2, the five systolic arrays are placed onto the decoder chip in a predefined ratio. The placement of cells may be optimized for error-only decoding, resulting in unutilized cells when decoding with erasures.

Controller Design

The implementation of the controller begins with the formulation of a system specification. This specification is matched to the system objectives and addresses such issues as the range of programmability, the mechanics of code selection, the communication system interface, and erasure identification. One particular design objective concerns the range of programmability that is to be supported. The systolic chips provide a tremendous range of programmability. This range of programmability may or may not be realized depending on the implementation of the controller. By restricting some of the programming parameters, such as the fields of interest, the size of fields, and the error correction capability there is a direct impact on the complexity of the controller design. For instance, the memory depths (LIFOs and FIFOs), and timing and control are directly related to the maximum size of n and t (the block size and the error correction capability).

FIG. 1 was used to depict the hardware requirements of the system. Each of the five major processing sections resides on the systolic processing chip. However, what is not shown in FIG. 1 are the memories used to coordinate the data flow between the major blocks and the necessary control signals. These operations are included in the controller design. There are two major functional components of the controller, System Support Hardware, and Timing and Control.

System support hardware includes all the data alignment memories (FIFOs and LIFOs), the zero detection logic, the error counter, the programmable finite-field element inversion and multiplier combination, the final rotational multiplier, the (error-correction) exclusive-or gate, and multiplexer circuits. The controller must also provide an interface to the communication system as well as a user interface for code selection. In addition to these hardware requirements the controller must generate all the timing and control signals for the system, including the two distinct operational modes of system configuration and initialization, and run-time decoding.

Preferably, the system support hardware contains all the FIFOs and LIFOs that are required to align and format the data as it moves between the five major systolic processors. In the preferred embodiment, there are ten of these data alignment memories plus a FIFO to delay the received polynomial until the error pattern has been determined. Seven of the memories have complexity of order t, requiring memories of maximum depth of 2 kbits. The remaining memories involve the block length n; three of them require memory depths of 4 kbits, and the last memory requires 8 kbits. The largest memory is the input data buffer that is shown in FIG. 1. That FIFO buffers the received polynomial, r(x), until the error polynomial, e(x), has been determined. This memory must buffer the received input for greater than four blocklengths. The amount by which it exceeds four blocks is related to t, but note that t can approach $$\frac{n}{4}.$$

This requires a FIFO depth greater than $4 \times 8 \times 2^m$ which for m=8 requires 14 kbits of FIFO memory. Each of these memories is only one bit wide resulting in a system-wide memory requirement of 34 kbits.

The system configuration control involves loading the field information to all appropriate circuits, and providing the roots of the generator polynomial to the syndrome calculator and the first root to the rotational multiplier. There is also the need to activate the correct number of Chien search processor cells during initialization. The remaining control takes on the form of the periodic control signals that orchestrate the movement of data through the system. In the preferred embodiment, there are a total of 60 timing and control signals that need to be generated, and these are broken into three distinct sections. The first is the initialization control. This involves all the configuration values including the roots of the generator polynomial, and the field polynomial. The timing signals necessary to load these values are also required. The second control section is the LIFO/FIFO memory control. It has all the one shot information concerning when to enable the LIFO/FIFO activities. This is not a periodic function and some activities are delayed as a function of n. The last function of the timing and control signal generator is to produce all the periodic control signals.

The timing and control signal generator is simply a programmable finite-state machine and can be implemented by many techniques.

In the proof-of-concept implementation, the controller was implemented using off-the-shelf circuits, together with a few custom CMOS "tiny" chips that perform finite-field operations. These "tiny" chips contain approximately 2000 transistors each. The brassboard controller realizes each of the three functions of the timing and signal generator finite-state machine with three electrically programmable read only memories (EPROMS). The values in these EPROMS are all that change between different codes, and these values are established with a program that accepts the parameters of any given code.

Alternative Embodiments

The embodiment described above by way of example is representative of decoder architecture according to the present invention. Variations in architecture and design can be used to develop systems that extend far beyond the specific capabilities of the example embodiment. For example:

(1) The algorithm implemented in the example embodiment, Eastman's algorithm, is not the only algorithm applicable for the programmable systolic architecture of the invention. Any other algorithm that solves the key equation and that can be mapped into a systolic hardware architecture is also appropriate and within the scope of the invention. (see, for example, Shao et al., cited above).

(2) The key equation algorithm developed by Eastman is not restricted to fields of the form $GF(2^m)$, therefore, the entire decoder architecture is applicable to processing over any field. In the example embodiment, fields were restricted to the form $GF(2^m)$ because of the form's relatively simple arithmetic structure and the ease with which it can be extended to be field-programmable processors.

(3) The decoder can be implemented as either a bit-serial processor or a word-parallel processor. In the example embodiment, a bit-serial processor was used for its significant size advantage and the ease with which a field-programmable multiplier can be implemented.

(4) Each of the five systolic processors of the systolic decoder chip is implemented as a bit-slice processor. The example embodiment used eight bit slices contained in each processor cell. This restricts the system's use to fields of the form $GF(2^m)$ where $m \leq 8$. The systolic decoder chip of the present invention will support processing over larger fields simply by adding more bit-slices within each systolic cell. The area requirements of the systolic decoder chip are proportional to the maximum value of m. Thus, the maximum symbol-error correction capability, t, that can be supported by a given chip area is inversely proportional to the number of bits in the field, m.

(5) The system architecture can be directly applied to non-programmable designs. In fact, any subset of the programming options included in the example embodiment can be selected for a specific implementation. This subset includes the fields, field polynomial, generator polynomial, and the error-correction capability, t. By sacrificing some of the flexibility, significant savings can be made in the controller design. In fact the most significant impact of these programming restrictions will be on the controller and more specifically the finite-state machine that is responsible for the timing and control signal generation. The hardware requirements of the systolic decoder chip that support the programmable nature of the design account for between 15 and 20% of the chip area. So once again, restrictions in this area will increase the cell density.

(6) To reduce, by a factor of two, the number of systolic cells that are required in the key equation processor array, in the example embodiment, codes were restricted to have code rates greater than $\frac{1}{2}$. By not folding the key equation systolic array arbitrary code rates can be supported by the system architecture.

Other modifications and variations of the present invention will occur to those skilled in the art, and it is intended that all such modifications and variations be within the scope of the following claims.

What is claimed is:

1. A programmable BCH decoder comprising:
a systolic decoder processor including a first systolic array implementing a syndrome calculator, a second systolic array implementing a key equation solver, a third systolic array implementing a zero locator, a fourth systolic array implementing a recursive extender, and a fifth systolic array implementing an inverse transform,
a control processor with input means for receiving decoding parameters of a BCH code and input means for receiving a coded sequence and output means for outputting a decoded sequence, and
communication means between said control processor and each of the systolic arrays of said systolic decoder processor for communication of systolic inputs from said control processor to each said array and for communication of systolic outputs from each said array to said control processor, and further communication means between said control processor and said systolic decoder processor for communication of timing and control data.

2. The decoder of claim 1 wherein said zero locator implements a Chien search.

3. The decoder of claim 1 wherein said key equation solver is mapped from Eastman's algorithm.

4. The decoder of claim 1 wherein the decoding parameters include the field of the BCH code, whereby said decoder is field-programmable.

5. The decoder of claim 1 wherein the decoding parameters include the field of the BCH code over the Galois field $GF(2^m)$ where m is an integer, whereby said decoder is field-programmable over the Galois field $GF(2^m)$.

6. The decoder of claim 1 wherein the decoding parameters include the code generator polynomial of the BCH code, whereby said decoder is code generator polynomial-programmable.

7. The decoder of claim 1 wherein the decoding parameters include the block length of the BCH code, whereby said decoder is block length-programmable.

8. The decoder of claim 1 wherein each said systolic array is a bit-serial processor.

9. The decoder of claim 1 wherein each said systolic array comprises cells, each cell having at least M bit-slices, and wherein said programmable decoder is field-programmable over the Galois fields $GF(2^m)$ where m is an integer less than or equal to M.

10. The decoder of claim 9 wherein M is equal to 8.

11. The decoder of claim 1 wherein the BCH code has a rate greater than $\frac{1}{2}$.

12. The decoder of claim 1 wherein said decoder is optimized for error-only decoding.

13. The decoder of claim 12 wherein said first systolic array comprises 2t cells, said second systolic array comprises $t+1$ cells, said third systolic array comprises $t+1$ cells, said fourth systolic array comprises t cells, and said fifth systolic array comprises t cells, where t is the error-correcting capability of the programmable decoder.

14. The decoder of claim 1 wherein said decoder is optimized for error and erasure decoding.

15. The decoder of claim 14 wherein said first systolic array comprises 2t cells, said second systolic array comprises t+1 cells, said third systolic array comprises 2t+1 cells, said fourth systolic array comprises 2t cells, and said fifth systolic array comprises 2t cells, where $\nu$ errors and $\mu$ erasures can be corrected provided $\mu + 2\nu \leq 2t$.

16. The decoder of claim 1 wherein said control processor implements a systolic cell associated with the key equation solver.

17. The decoder of claim 1 wherein said control processor implements a systolic cell associated with the recursive extender.

18. The decoder of claim 1 wherein the systolic arrays are resident on a single systolic decoder processor microchip.

19. The decoder of claim 1 wherein said systolic decoder processor comprises an array of M microchips, each microchip including a first systolic array implementing a syndrome calculator with n1 cells, a second systolic array implementing a key equation solver with n2 cells, a third systolic array implementing a zero locator with n3 cells, a fourth systolic array implementing a recursive extender with n4 cells, and a fifth systolic array implementing an inverse transform with n5 cells, and further comprises communication means between said microchips whereby said array of M microchips implements a systolic syndrome calculator with $M \times n1$ cells, a systolic key equation solver with $M \times n2$ cells, a systolic zero locator with $M \times n3$ cells, a systolic recursive extender with $M \times n4$ cells, and a systolic inverse transform with $M \times n5$ cells.

* * * * *